(12) United States Patent
Lopez et al.

(10) Patent No.: US 11,949,041 B2
(45) Date of Patent: Apr. 2, 2024

(54) NANO-PHOTONICS REFLECTOR FOR LED EMITTERS

(71) Applicant: LUMILEDS LLC, San Jose, CA (US)

(72) Inventors: Toni Lopez, Aachen (DE); Venkata Ananth Tamma, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 18/082,377

(22) Filed: Dec. 15, 2022

(65) Prior Publication Data

US 2023/0197894 A1     Jun. 22, 2023

Related U.S. Application Data

(63) Continuation of application No. 17/246,398, filed on Apr. 30, 2021, now Pat. No. 11,532,766, which is a
(Continued)

(30) Foreign Application Priority Data

Jan. 23, 2018   (EP) .................................... 18152921

(51) Int. Cl.
*H01L 33/10* (2010.01)
*B82Y 20/00* (2011.01)
(Continued)

(52) U.S. Cl.
CPC ............ *H01L 33/10* (2013.01); *G02B 6/1225* (2013.01); *H01L 33/30* (2013.01); *H01L 33/405* (2013.01);
(Continued)

(58) Field of Classification Search
CPC ....... H01L 33/10; H01L 33/405; H01L 33/46; H01L 2933/0083; H01L 33/30;
(Continued)

(56) References Cited

U.S. PATENT DOCUMENTS 7,986,722 B2   7/2011   Higuchi et al.
8,017,963 B2   9/2011   Donofrio et al.
(Continued)

FOREIGN PATENT DOCUMENTS

CN   102820398 A   12/2012
CN   104106184 A   10/2014
(Continued)

OTHER PUBLICATIONS

Huang et al., "Light extraction enhancement for InGaN/GaN LED by three dimensional auto-cloned photonics crystal", Optics Express, vol. 17, No. 26, pp. 23702-23711, Dec. 11, 2009.
(Continued)

*Primary Examiner* — Sonya McCall-Shepard

(57) ABSTRACT

A system, method and device for use as a reflector for a light emitting diode (LED) are disclosed. The system, method and device include a first layer designed to reflect transverse-electric (TE) radiation emitted by the LED, a second layer designed to block transverse-magnetic (TM) radiation emitted from the LED, and a plurality of ITO layers designed to operate as a transparent conducting oxide layer. The first layer may be a one-dimension (1D) distributed Bragg reflective (DBR) layer. The second layer may be a two-dimension (2D) photonic crystal (PhC), a three-dimension (3D) PhC, and/or a hyperbolic metamaterial (HMM). The 2D PhC may include horizontal cylinder bars, vertical cylinder bars, or both. The system, method and device may include a bottom metal reflector that may be Ag free and may act as a bonding layer.

17 Claims, 8 Drawing Sheets

Related U.S. Application Data continuation of application No. 16/160,713, filed on Oct. 15, 2018, now Pat. No. 11,024,767.

(60) Provisional application No. 62/573,382, filed on Oct. 17, 2017.

(51) Int. Cl.

| | | |
|---|---|---|
| *G02B 1/00* | (2006.01) | |
| *G02B 5/00* | (2006.01) | |
| *G02B 5/30* | (2006.01) | |
| *G02B 6/122* | (2006.01) | |
| *G02B 27/28* | (2006.01) | |
| *H01L 33/30* | (2010.01) | |
| *H01L 33/32* | (2010.01) | |
| *H01L 33/40* | (2010.01) | |
| *H01L 33/42* | (2010.01) | |
| *H01L 33/46* | (2010.01) | |

(52) U.S. Cl.
CPC .............. *H01L 33/42* (2013.01); *H01L 33/46* (2013.01); *B82Y 20/00* (2013.01); *G02B 5/00* (2013.01); *H01L 33/32* (2013.01); *H01L 2933/0083* (2013.01)

(58) Field of Classification Search
CPC . H01L 33/32; H01L 33/60; H01L 2933/0058; G02B 6/1225; G02B 5/00; G02B 1/005; G02B 5/3041; B82Y 20/00
See application file for complete search history.

(56) References Cited

U.S. PATENT DOCUMENTS

| | | | |
|---|---|---|---|
| 9,929,317 B2* | 3/2018 | Kashima | ................. H01L 33/22 |
| 10,879,408 B2 | 12/2020 | Jorgenson | |
| 11,024,767 B2 | 6/2021 | Lopez et al. | |
| 11,532,766 B2 | 12/2022 | Lopez et al. | |
| 2003/0235229 A1 | 12/2003 | Deng et al. | |
| 2004/0099869 A1 | 5/2004 | Gaska et al. | |
| 2008/0061304 A1 | 3/2008 | Huang et al. | |
| 2010/0158067 A1 | 6/2010 | Nakatsuka et al. | |
| 2012/0175654 A1 | 7/2012 | Chao et al. | |
| 2012/0228653 A1 | 9/2012 | Ishida et al. | |
| 2013/0161677 A1 | 6/2013 | Lin et al. | |
| 2015/0034901 A1 | 2/2015 | Noda et al. | |
| 2015/0349220 A1 | 12/2015 | Moon et al. | |
| 2016/0260869 A1 | 9/2016 | Jeon et al. | |
| 2017/0005242 A1 | 1/2017 | Kim et al. | |
| 2017/0110626 A1 | 4/2017 | Jorgenson | |
| 2017/0294629 A1 | 10/2017 | Kim et al. | |

FOREIGN PATENT DOCUMENTS

| | | |
|---|---|---|
| CN | 105280771 A | 1/2016 |
| EP | 2950355 A1 | 12/2015 |
| JP | 2005197650 A | 7/2005 |
| JP | 2006196658 A | 7/2006 |
| JP | 2010123921 A | 6/2010 |
| JP | 2016146407 A | 8/2016 |

OTHER PUBLICATIONS

From the EPO as the ISA, Notification of Transmittal of the International Search Report and the Written Opinion of the International Searching Authority corresponding to PCT/US2018/056062, dated Jan. 18, 2019, 13 pages.
The extended European Search Report corresponding to EP application No. 18152921.5 dated Jun. 25, 2018, 8 pages.
Devashish et al., "Reflectivity calculated for a three-dimensional silicon photonic band gap crystal with finite support," Phys. Ref. B 95, 155141 (Apr. 26, 2017).
Fink et al., "A Dielectric Omnidirectional Reflector," Science pp. 1679-1682 (Nov. 27, 1998).
Narimanov, "Photonic Hypercrystals," Phys. Rev. X 4, 041014 (Oct. 27, 2014).
Wang et al., "Metasurface integrated high energy efficient and high linearly polarized InGaN/GaN light emitting diode," Royal Society of Chemistry, From the Journal: Nanoscale (2017).
Xi et al., "Internal high-reflectivity omni-directional reflectors," Appl. Phys. Lett. 87, 031111 (2005).

* cited by examiner

NANO-PHOTONICS REFLECTOR FOR LED EMITTERS

CROSS REFERENCE TO RELATED APPLICATION

This application is a continuation of U.S. patent application Ser. No. 17/246,398 filed Apr. 30, 2021, which is a continuation of U.S. patent application Ser. No. 16/160,713 filed Oct. 15, 2018 (now U.S. Pat. No. 11,024,767), which claims the benefit of priority of U.S. Provisional Application No. 62/573,382 filed Oct. 17, 2017 and European Patent Application No. 18152921.5 filed Jan. 23, 2018. All of the above applications are incorporated by reference in their entirety.

FIELD OF INVENTION

The present invention is directed to a nano-photonics reflector for light emitting diode (LED) emitters, and more particularly, to a reflector structure that improves the limited reflectance of the distributed Bragg reflector (DBR) to fully block the incident light.

BACKGROUND

The reflectance of typical composite mirror architectures is limited by the index contrast between the semiconductor and a rather thick oxide layer separating the lossy metal reflector. Light incident at angles outside the critical cone interact with the metal and hence get partly absorbed. To improve this, a distributed Bragg reflector (DBR) structure might be placed between the thick oxide layer and the metal reflector. Practical DBR designs however employ layers with restricted refractive index contrast that ends up limiting the performance gains.

There is a need, therefore, for a reflector structure that improves the limited reflectance of the DBR to fully block the incident light efficiently.

SUMMARY

A system, method and device for use as a reflector for a light emitting diode (LED) are disclosed. The system, method and device include a first layer designed to reflect transverse-electric (TE) radiation emitted by the LED, a second layer designed to block transverse-magnetic (TM) radiation emitted from the LED, and a plurality of ITO layers designed to operate as a transparent conducting oxide layer.

The first layer may be a one-dimension (1D) distributed Bragg reflective (DBR) layer. The second layer may be a two-dimension (2D) photonic crystal (PhC), a three-dimension (3D) PhC, and/or a hyperbolic metamaterial (HMM). The 2D PhC may include horizontal cylinder bars, vertical cylinder bars, or both. The system, method and device may include a bottom metal reflector that may be Ag free and may act as a bonding layer.

BRIEF DESCRIPTION OF THE DRAWINGS

A more detailed understanding can be had from the following description, given by way of example in conjunction with the accompanying drawings wherein.

DETAILED DESCRIPTION

Figure 1:
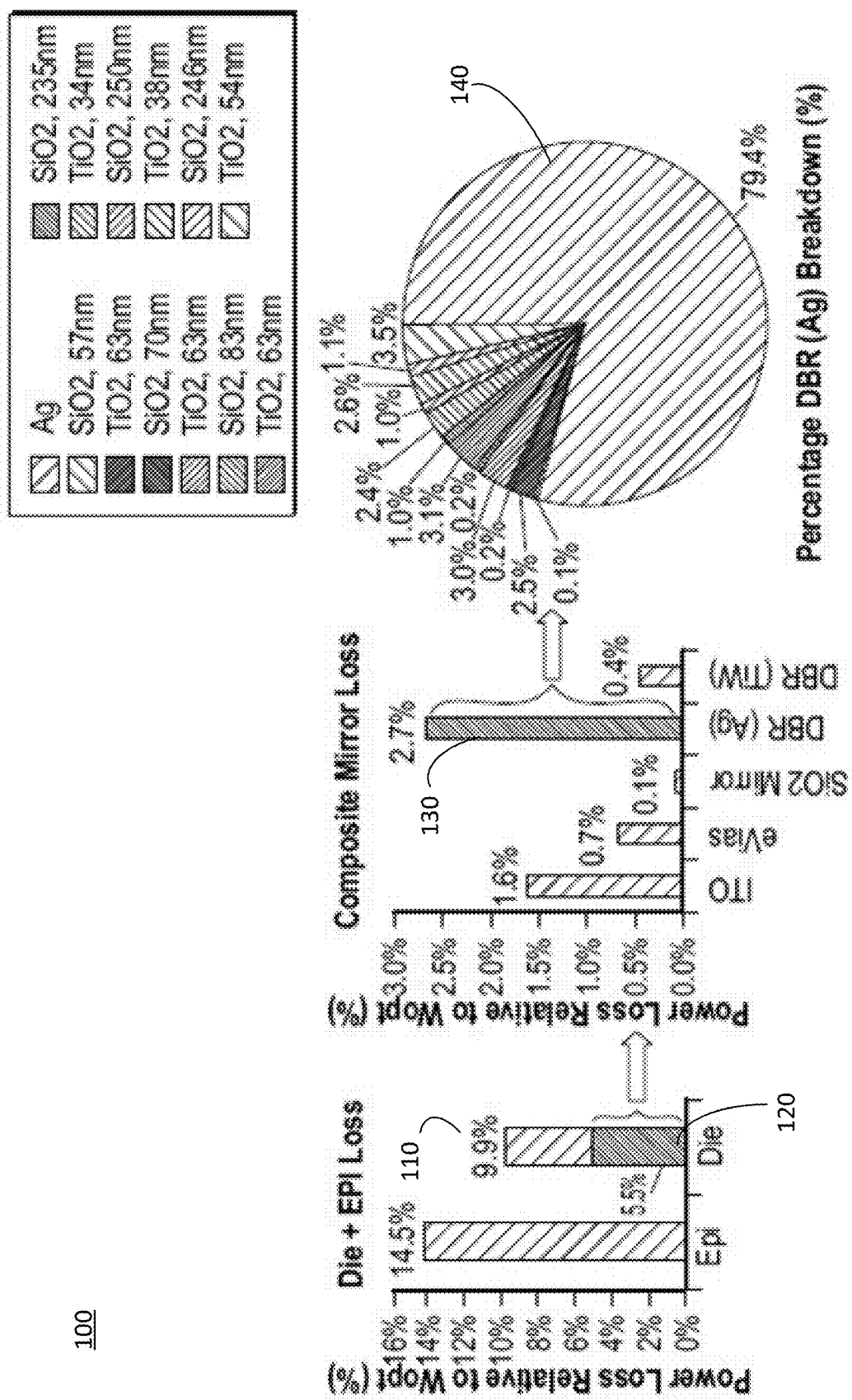
FIG. 1 illustrates a light emitting diode (LED) composite mirror loss contribution.

In the following description, numerous specific details are set forth, such as particular structures, components, materials, dimensions, processing steps, and techniques, in order to provide a thorough understanding of the present embodiments. However, it will be appreciated by one of ordinary skill of the art that the embodiments may be practiced without these specific details. In other instances, well-known structures or processing steps have not been described in detail in order to avoid obscuring the embodiments. It will be understood that when an element such as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments in the following detailed description, some structures, components, materials, dimensions, processing steps, and techniques that are known in the art may have been combined together for presentation and for illustration purposes and in some instances may have not been described in detail. In other instances, some structures, components, materials, dimensions, processing steps, and techniques that are known in the art may not be described at all. It should be understood that the following description is rather focused on the distinctive features or elements of various embodiments described herein.

A reflector structure that improves the limited reflectance of the distributed Bragg reflector (DBR) to fully block the incident light efficiently is disclosed. Particularly, the reflector structure increases reflectance in practical DBR architectures, reduces transverse-magnetic (TM) polarization related losses, reflects TM polarization radiation with practical (industrially mature) material selection (silicon dioxide ($SiO_2$), titanium oxide ($TiO_2$) magnesium fluoride (MgF) and niobium oxide($Nb_2O_5$), mitigates light interaction with a metal reflector, thus enabling silver (Ag) free solutions, which may offer significant advantages at high temperature, high current density (i.e. reliable, robust solutions) and/or ultraviolet (UV) emitters, provides a gold (Au) reflector as alternative to Ag to provide a more reliable solution, increases extraction efficiency (ExE) and color efficiency (CE) in direct phosphor-converted LED (pcLED) emitters, and improves directionality (i.e., increased brightness). Additionally, the present reflector structure may provide a complete bandgap DBR by using materials, such as materials with extremely high refractive indices (RI).

Current DBR designs employ layers with restricted refractive index contrast that end up limiting the performance gains. For example, FIG. 1 illustrates a light emitting diode (LED) loss breakdown composite mirror loss contribution. Any LED may benefit from the designs herein. This is generally a DBR between silver mirrors. FIG. 1 shows the loss breakdown 100 of the LED equipped with a composite mirror die including the DBR. The loss breakdown illustrates that 55% (5.5/9.9) of the die losses 110 are due to composite mirror absorption 120. The losses correspond to approximately 5.5% of all generated (blue) light. Of the 5.5% of blue light losses, 50% (2.7/5.5) is due to DBR (Ag) losses 130. Of the approximately 2.7% of DBR (Ag) losses 130, about 80% (79.4%) is attributable to Ag losses 140. Therefore, DBR is blocking light interaction with the metal. As shown, $TiO_2$ losses in DBR (Ag) account for 17% of the absorption loss. Based on these statistics, an improvement opportunity exists for scenarios where the Ag losses are mitigated or eliminated.

Figure 2:
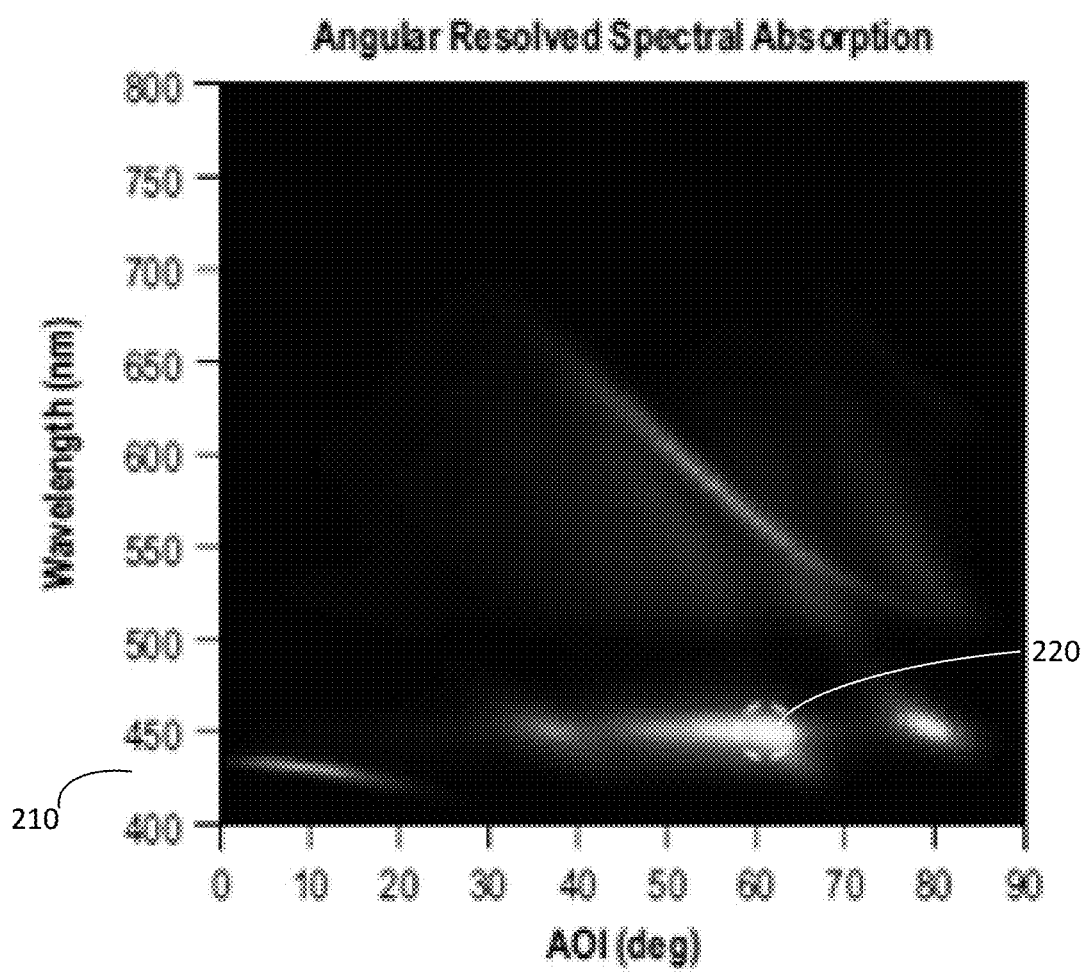
FIG. 2 illustrates an angular resolved spectral distributed Bragg reflector (DBR) loss breakdown in a composite mirror LED emitter demonstrating that losses are highest in the blue and 60° angle of incidence (AOI)

FIG. 2 illustrates an angular resolved spectral distributed Bragg reflector (DBR) loss breakdown 200 in the composite mirror LED emitter depicted from FIG. 1. The loss breakdown 200 demonstrates that losses are highest in the blue wavelengths 210, such as around 450 nm, for example, and approximately 60° angle of incidence. This area 220 is highlighted within FIG. 2.

Figure 3:
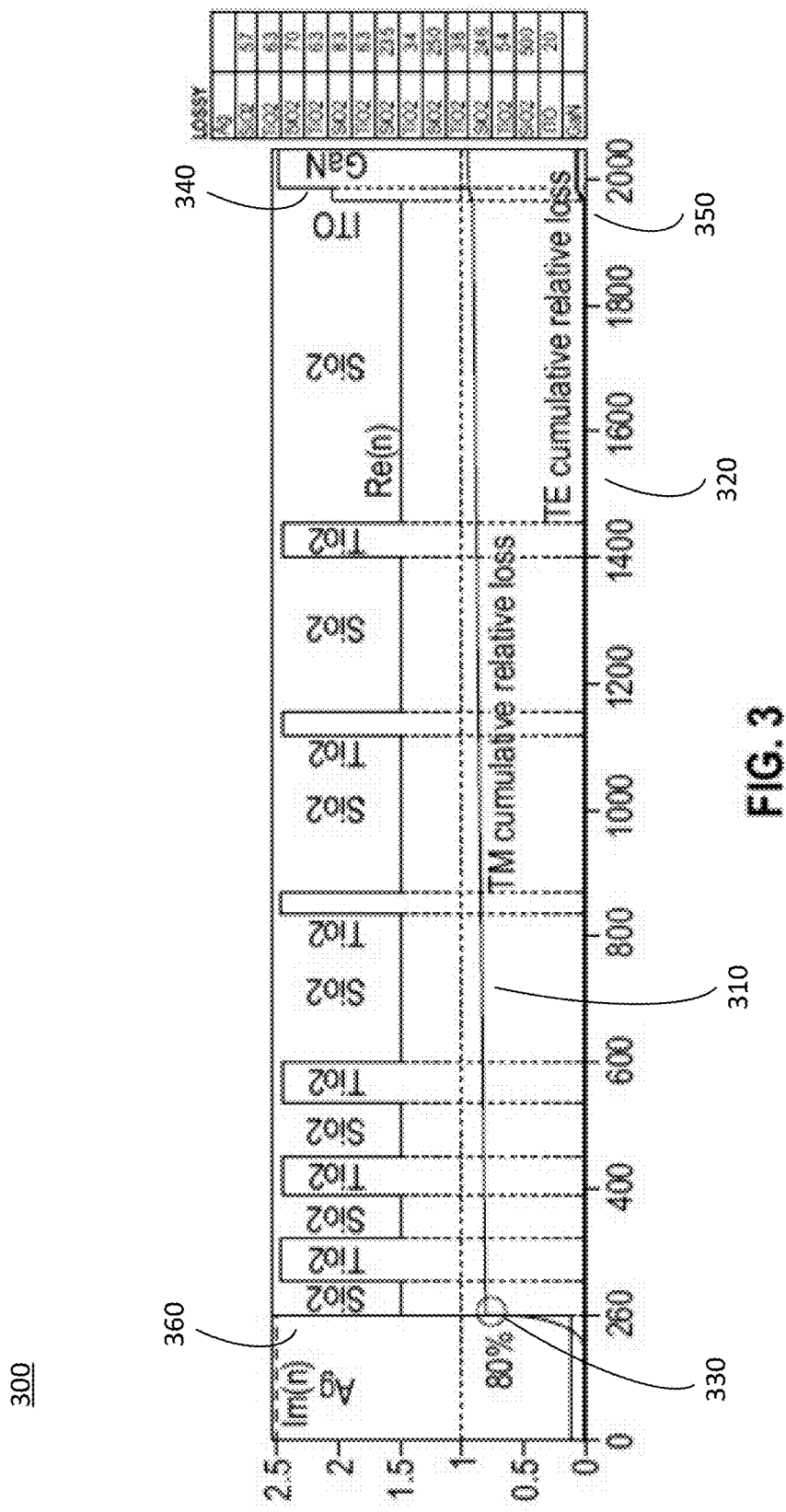
FIG. 3 illustrates a DBR cumulative loss at 60° AOI at 450 nm corresponding to the location of maxima in FIG. 1.

FIG. 3 illustrates a DBR cumulative loss 300 at 60° angle of incidence (AOI) at 450 nm corresponding to the location of maxima in FIG. 1. P polarization is referred to as transverse-magnetic (TM), and has also in the field been called pi-polarized or tangential plane polarized. S polarization is referred to as transverse-electric (TE), and has also in the field been called sigma-polarized or sagittal plane polarized. The transverse-electric (TE) cumulative loss 320 and transverse-magnetic (TM) cumulative loss 310 at 450 nm for 32° AOI are shown in FIG. 3. The TM cumulative relative loss 310 peaks to approximately 80% (shown at point 330) at a thickness of 200 nm (the Ag layer) and continues to steadily rise until a jump 340 is demonstrated at a thickness of approximately 2000 nm (the ITO layer). The TE cumulative relative loss 320 remains near zero with a small increase 350 at thickness of approximately 2000 nm (the ITO layer). The losses (the majority of the TM losses occur in the first 200 nm of thickness attributable to the Ag layer) are dominated by Ag absorption 360 of TM radiation in the Brewster angular range.

FIG. 2 and FIG. 3 demonstrate that from the angular resolved spectral loss, the losses peak at 450 nm near 60° angle of incidence, which coincides with the Brewster angle. The cumulative loss distribution across DBR layers at the peak loss region clearly shows that TM absorption dominates as it reaches the Ag layers and gets absorbed, while TE loss contribution is very low and primarily due to indium tin oxide (ITO) losses.

Figure 4:
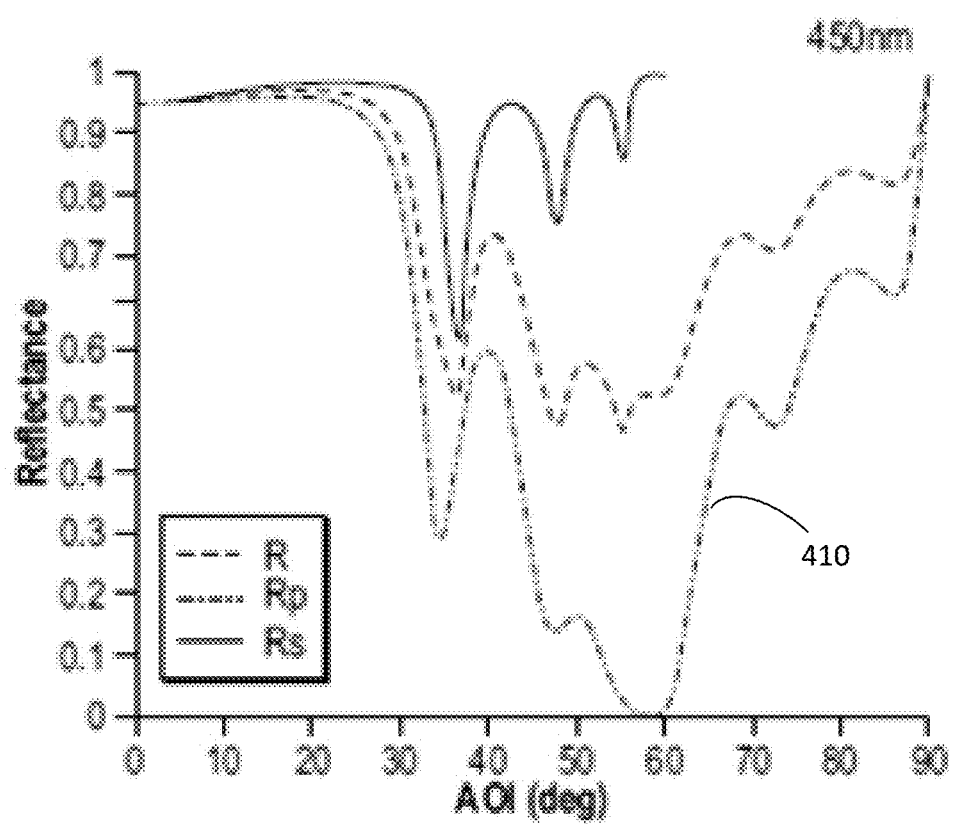
FIG. 4 illustrates a polarization dependence reflectance at 450 nm demonstrating that transverse-magnetic (TM) polarization reflectance is low in the Brewster angle region.

FIG. 4 illustrates a polarization dependence reflectance 400 at 450 nm of the composite mirror LED. The plot of the reflectance 400 demonstrates that TM polarization reflectance 410 is low in the Brewster angle (near 60°) region. A comparison between reflection of the p-polarization (Rp) and the reflection of the s-polarization (Rs) in FIG. 4 confirms that TM reflectivity is the poorest (as Rp is the lower of the three reflectance values, with R in the middle and Rs as the largest). The weakest TM reflectance 410, which is the maximum Ag exposure, is around 60°. The Brewster angle (100% transmission) is defined by: a tan (nTiO2/nSiO2)≈60°), and hence the associated losses cannot be avoided with the selected materials.

Figure 5:
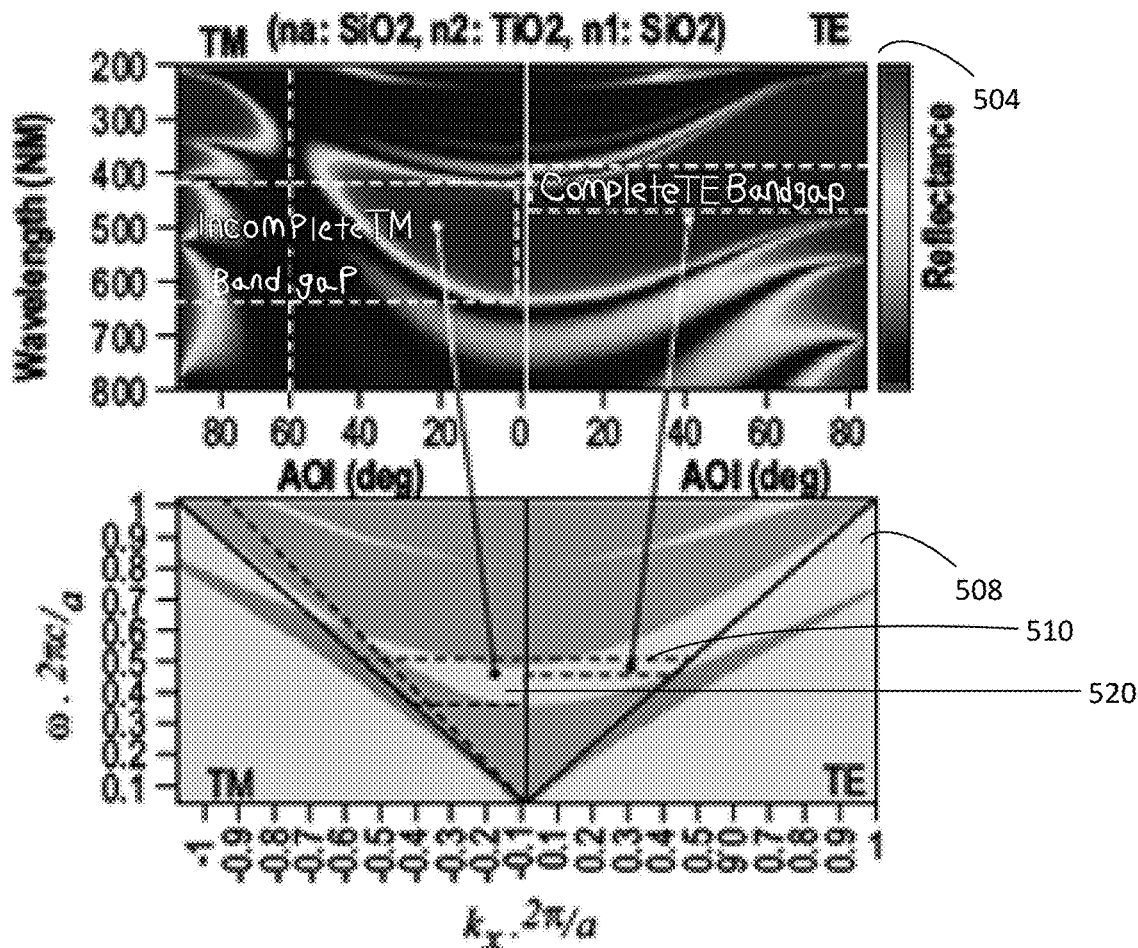
FIG. 5 illustrates the relation between band diagram and reflectance for a typical DBR solution which can be compared to FIG. 3.

FIG. 5 illustrates the relation 500 between band diagram 508 and reflectance 504 in the case of a DBR as described with respect to FIG. 3. As shown, the dark grey regions are allowed states. The band diagram 508 of FIG. 5 for a DBR reveals that a photonic bandgap may be engineered for TE around the pump wavelength (where losses are the highest) but TM polarization cannot be blocked (i.e., fully reflected). The complete TE bandgap is illustrated in the labeled box 510 in the figure that remains all light grey. The incomplete TM bandgap is illustrated in the labeled box 520 in the figure that does not remain completely light grey. As a result, the incomplete TM bandgap illustrates that the losses cannot be avoided with the materials selected, as was concluded and described with respect to FIG. 4.

Figure 6:
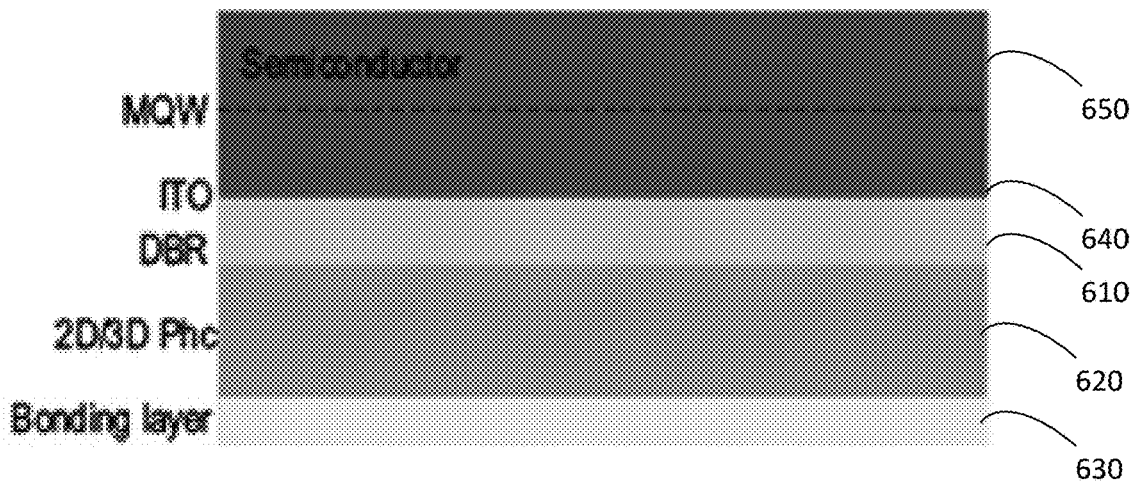
FIG. 6 illustrates a reflector with one dimension (1D) DBR plus two dimensions (2D) photonic crystals (PhC) or three dimensions (3D) PhC.

FIG. 6 illustrates a reflector 600 with one dimension (1D) DBR 610 plus two dimensions (2D) photonic crystals (PhC) 620 and/or three dimensions (3D) PhC 620. FIG. 6 shows one possible embodiment of such a reflector 600 adjacent to a semiconductor layer 650. The reflector combines a 1D DBR structure 610 with a 2D PhC 620 and/or 3D PhC 620. The PhC 620 may include material pairs, such as SiO2 and TiO2, as would be understood by those possessing an ordinary skill in the art. The PhC 620 may include cylinder bars arranged vertically or horizontally, although the figure illustrates the horizontal arrangement of a 2D PhC 620. In the vertical arrangement, the PhC 620 becomes 3D. Other geometries may be used including vertical cylinders, spheres, woodpiles, and combinations of these. The bottom metal reflector may be Ag free and therefore may be understood to be a bonding layer 630.

The respective layers of the reflector include the 1D DBR 610 designed to reflect TE radiation, and 2D/3D PhC 620 structures to block TM radiation. The thickness of the 2D/3D PhC structures 620 may be approximately the same size as the DBR layer 610. There may also be ITO layer(s) 640 adjacent to the multiple quantum well (MQW) of the semiconductor layer 650. The ITO layer(s) 640 operates as a transparent conducting oxide layer.

While the present description indicates that the TE radiation is reflected before the TM radiation is reflected, this order may be reversed. Also, the layers may operate to reflect TM radiation, then TE radiation, and then an additional layer may be designed to reflect any additional TM radiation. As would be understood to those possessing an ordinary skill in the art, the use of metal in layers affects the transmission and reflection of both TE and TM radiation.

Although these structures of FIG. 6 do not feature a full photonic bandgap, the structures may feature a complete bandgap for TM radiation. Thus, the need to use the 1D DBR 610 in order to reflect TE radiation.

Figure 7:
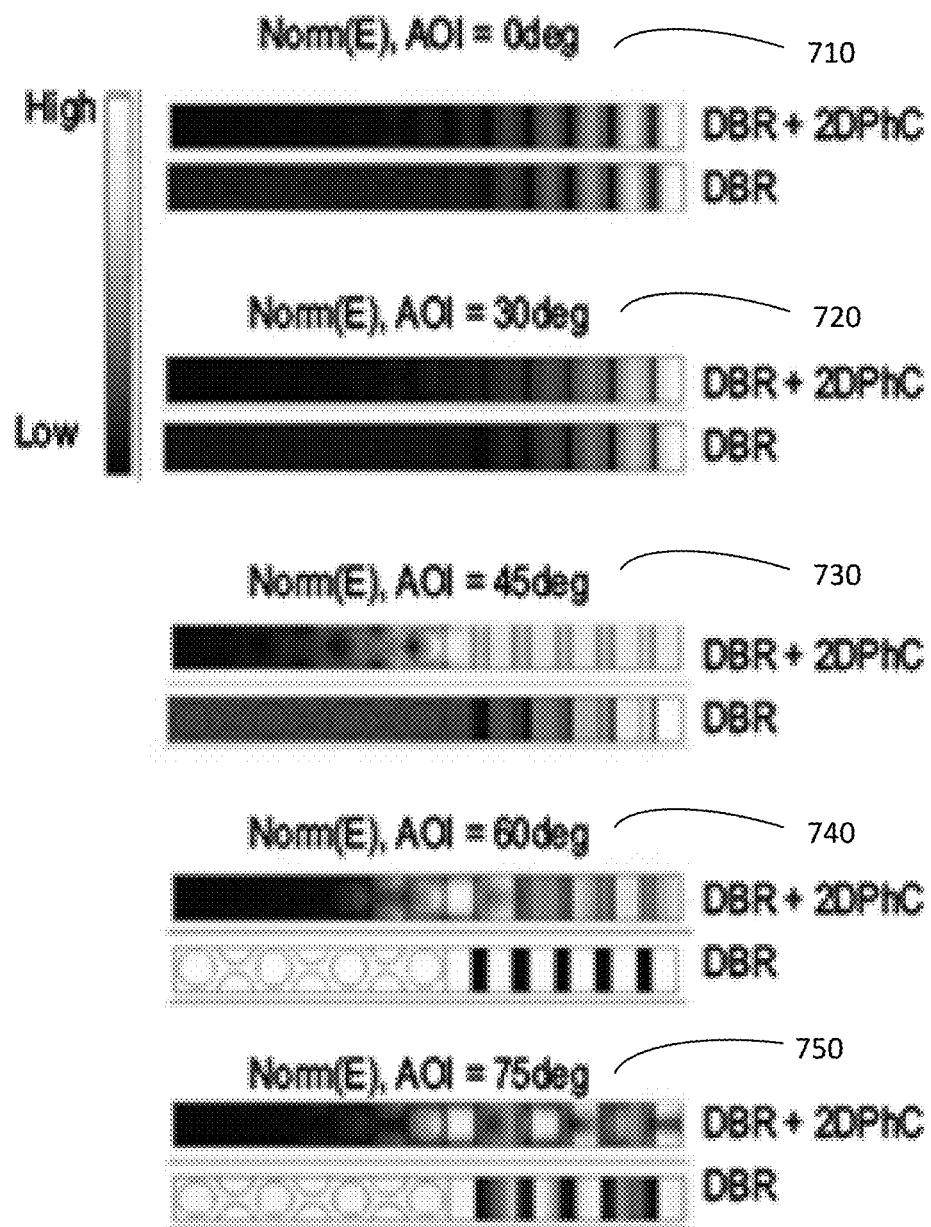
FIG. 7 illustrates the electric field normal at various AOIs (450 nm) of the reflector of FIG. 6 using SiO2 and TiOx layers.

FIG. 7 illustrates the electric field normal 700 at various AOIs for 450 nm light. Illustrated are the electric field normal of the DBR and the combined 1D DBR and 2D PhC using $SiO_2$ and $TiO_x$ layers of FIG. 6. As may be seen, the field intensity shows that only a few periodic layers are necessary to fully reflect the incoming waves.

Specifically, as is illustrated in the first (AOI=0 degrees) 710 of the five comparisons the DBR and DBR plus 2DPhC look alike so there is no difference indicated at AOI-0 degrees. Similarly, at AOI=30 degrees 720 the DBR and DBR plus 2DPhC look alike, but slight variations in performance are starting to show. Notably, the DBR portion deviates slightly from that same depiction at 0 degrees for example. The next three comparisons at AOIs of 45 degrees 730, 60 degrees 740 and 75 degrees 750 illustrate that the combination DBR plus 2DPhC functions much better and further illustrates the DBR performance degrading.

Figure 8:
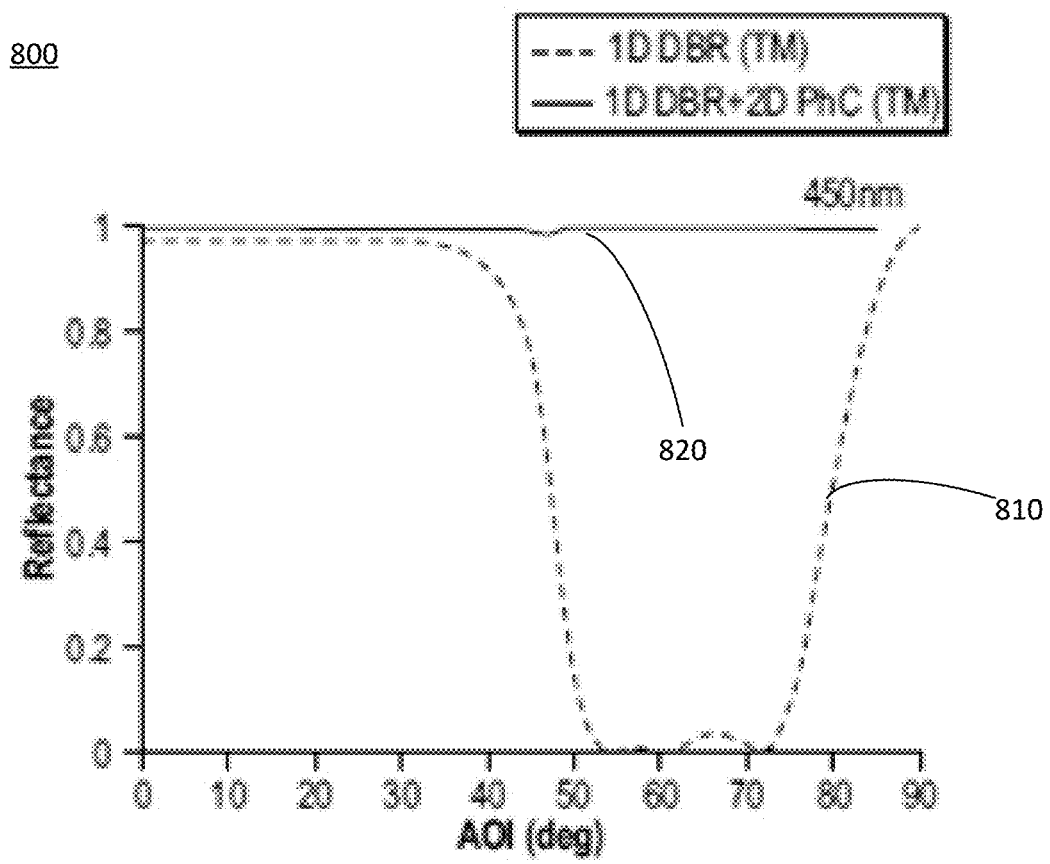
FIG. 8 illustrates the reflectance response at 450 nm of both 1D DBR and the reflector of FIG. 6.

FIG. 8 illustrates the reflectance plot 800 at 450 nm of both 1D DBR reflectance 810 and the reflector of FIG. 6 reflectance 820. As shown, the 1D DBR reflectance of TM 810 begins decreasing at approximately 40° AOI and by 50° and until nearly 80° is lower than 20%, until finally increasing beyond 80°. On the other hand, the 1D DBR plus 2D PhC reflectance of TM 820 remains very high approaching approximately 100%.

Collectively FIG. 7 and FIG. 8 show the effectiveness of the combined 1D DBR plus 2D PhC (the reflector of FIG. 6) to obtain nearly 100% reflectivity at pump wavelength.

Figure 9:
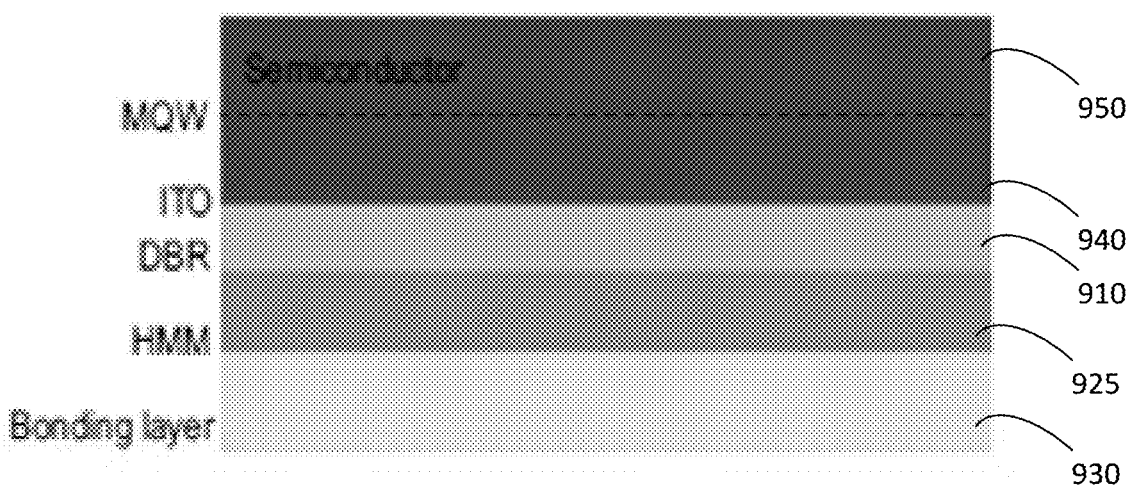
FIG. 9 illustrates a reflector with 1D DBR and a hyperbolic metamaterial (HMM) layer.

FIG. 9 illustrates a reflector 900 with 1D DBR 910 and a hyperbolic metamaterial (HMM) layer 925. The respective layers of the reflector include the 1D DBR 910 designed to reflect TE radiation, and the HMM layer 925 to block TM radiation: The thickness of the HMM layer 925 may be approximately the same size as the DBR layer 910. The HMM layer 925 may be thinner than the corresponding PhC layer 620 of FIG. 6. The HMM layer 925 may include nano-engineered material designed with certain properties to tailor light-emitter interaction at the nanoscale. There may also be ITO layer(s) 940 adjacent to the MQW of the semiconductor layer 950. The ITO layer(s) 940 operates as a transparent conducting oxide layer. The bottom metal reflector may be Ag free (e.g., bonding layer 930).

In the reflector 900 illustrated in FIG. 9, many of the layers are similar to the layers described with respect to the reflector 600 of FIG. 6. The PhC 620 from FIG. 6 is replaced by a HMM layer 925. The HMM layer 925 may be formed in a number of different ways, for instance, by alternating metal/dielectric layers of subwavelength thickness. Other methods of creating HMM layer 925 are listed in an article entitled Photonic Hypercrystals by Evgenii E. Narimanov (Phys. Rev X 4, 041014 (2014)). The presence of the HMM layer 925 creates surface modes that enable the forming of complete TM bandgaps.

Figure 10:
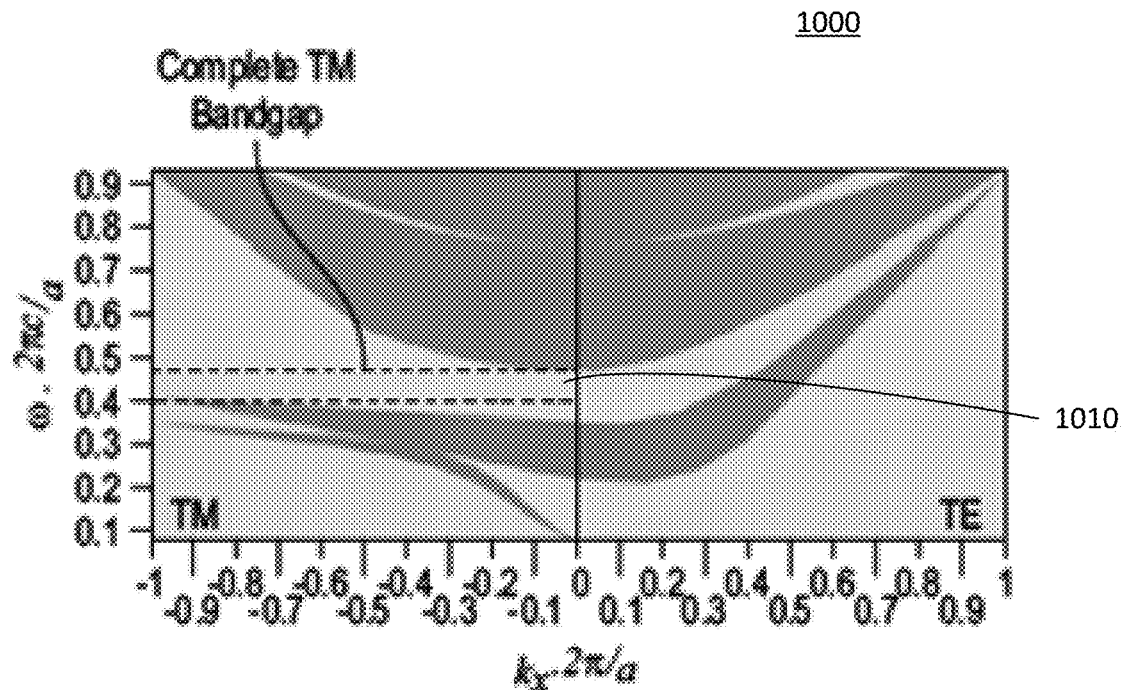
FIG. 10 illustrates a bandgap diagram for the reflector of FIG. 9 using a HMM formed by metal-dielectric pairs of deep sub-wavelength thickness.

FIG. 10 illustrates a bandgap diagram 1000 of the reflector 900 of FIG. 9 with the HMM layer 925 formed by metal-dielectric pairs of sub-wavelength thickness. The bandgap diagram 1000 shows that a complete TM bandgap 1010 may be formed. Again, the dark grey regions are allowed states. The indicated area of the TM region provides a complete TM bandgap 1010 because the entire region is light grey. Thus, by combining this HMM layer 925 with a conventional 1D DBR 910, a complete bandgap structure is achieved.

Figure 11:
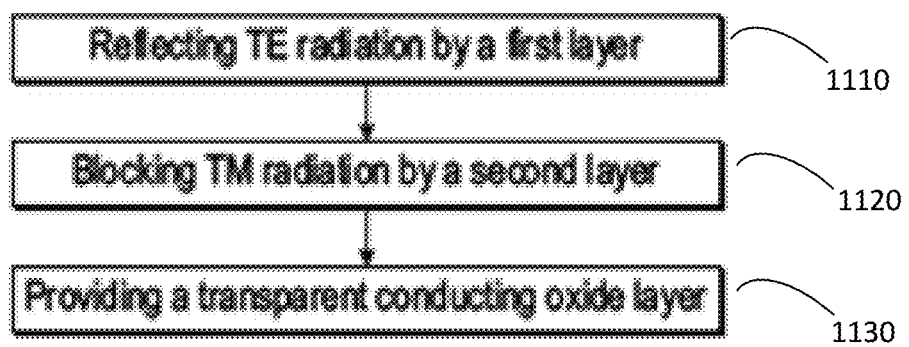
FIG. 11 illustrates a method of reflecting light emitted from an LED.

FIG. 11 illustrates a method 1100 of reflecting light emitted from an LED. The method 1100 includes reflecting transverse-electric (TE) radiation emitted by the LED by a first layer at step 1110, blocking transverse-magnetic (TM) radiation emitted from the LED by a second layer at step 1120, and providing a transparent conducting oxide layer with a plurality of ITO layers ag step 1130.

The first layer may be a one-dimension (1D) distributed Bragg reflective (DBR) layer 610, 910. The second layer may be a two-dimension (2D) photonic crystal (PhC) 620, a three-dimension (3D) PhC 620, and/or a hyperbolic metamaterial (HMM) 925. The 2D PhC 620 may include horizontal cylinder bars, vertical cylinder bars, or both. The method 1100 may include providing a bonding layer 630, 930 that may include a metal reflector that is Ag free. The first layer and the second layer may be approximately the same thickness.

Although features and elements are described above in particular combinations, one of ordinary skill in the art will appreciate that each feature or element can be used alone or in any combination with or without the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A light emitting diode (LED) device comprising:
    a light emitting semiconductor structure that in operation emits light having a peak wavelength,
    a reflective structure comprising:
        a distributed Bragg reflector (DBR) configured to reflect light emitted by the light emitting semiconductor structure at the peak wavelength and incident with transverse-electric (TE) polarization on the reflective structure; and
        a reflective layer configured to reflect light emitted by the light emitting semiconductor structure at the peak wavelength and incident with transverse-magnetic (TM) polarization on the reflective structure, the reflective layer comprising one or more of $SiO_2$, $TiO_2$, MgF, and $Nb_2O_5$; and
        a bottom metal reflector that is Ag free.

2. The LED device of claim 1, wherein the light emitting semiconductor structure is a III/V direct bandgap semiconductor.

3. The LED device of claim 1, wherein the bottom metal reflector comprises Au.

4. The LED device of claim 1, wherein the bottom metal reflector is in direct contact with the reflective layer.

5. The LED device of claim 1, wherein the bottom metal reflector is not in direct contact with the DBR nor the light emitting semiconductor structure.

6. The LED device of claim 1, wherein the reflective layer is between the DBR and the bottom metal reflector.

7. The LED device of claim 1, further comprising a transparent conducting metal oxide layer adjacent to the light emitting semiconductor structure.

8. The LED device of claim 7, wherein the transparent conducting metal oxide layer is an ITO layer.

9. The LED device of claim 1, wherein the DBR is disposed between the reflective layer and the light emitting semiconductor structure.

10. The LED device of claim 1, wherein the reflective layer is disposed between the DBR and the light emitting semiconductor structure.

11. The LED device of claim 1, wherein the reflective layer comprises metal and dielectric.

12. The LED device of claim 1, wherein the reflective layer and the DBR are approximately a same thickness.

13. A light emitting diode (LED) device comprising:
a light emitting semiconductor structure that in operation emits light having a peak wavelength,
a reflective structure comprising:
a distributed Bragg reflector (DBR) configured to reflect light emitted by the light emitting semiconductor structure at the peak wavelength and incident with S polarization on the reflective structure; and
a reflective layer in direct contact with the DBR and configured to reflect light emitted by the light emitting semiconductor structure at the peak wavelength and incident with P polarization on the reflective structure;
wherein the DBR is disposed between the reflective layer and the light emitting semiconductor structure.

14. The LED device of claim 13, wherein the light emitting semiconductor structure is a III/V semiconductor.

15. The LED device of claim 13, further comprising a transparent conducting metal oxide layer adjacent to the light emitting semiconductor structure.

16. The LED device of claim 13, wherein the reflective layer is disposed between the DBR and the light emitting semiconductor structure.

17. A light emitting diode (LED) device comprising:
a light emitting semiconductor structure that in operation emits light having a peak wavelength,
a transparent conducting metal oxide layer adjacent to the light emitting semiconductor structure; and
a reflective structure comprising:
a distributed Bragg reflector (DBR) having a first thickness and configured to reflect light emitted by the light emitting semiconductor structure at the peak wavelength and incident with transverse-electric (TE) polarization on the reflective structure; and
a reflective layer configured to reflect light emitted by the light emitting semiconductor structure at the peak wavelength and incident with TM polarization on the reflective structure, the reflective layer having a second thickness that is a same as or thinner than the first thickness of the DBR.

* * * * *